United States Patent [19]

Karidis et al.

[11] Patent Number: 5,153,472
[45] Date of Patent: Oct. 6, 1992

[54] PROBE POSITIONING ACTUATOR

[75] Inventors: John P. Karidis, Ossining; Gerard Mc Vicker, Wappingers Falls; Joseph P. Pawletko, Endwell; Ralph R. Comulada, Jr., Rock Tavern, all of N.Y.

[73] Assignee: International Business Machines Corporation, Armonk, N.Y.

[21] Appl. No.: 732,557

[22] Filed: Jul. 19, 1991

[51] Int. Cl.⁵ .............................. H02K 41/00
[52] U.S. Cl. ........................ 310/13; 310/12; 324/158 P
[58] Field of Search ............. 310/12, 13, 14, 273; 318/135; 324/158 P, 158 F, 72.5

[56] References Cited

U.S. PATENT DOCUMENTS

| | | | |
|---|---|---|---|
| 3,351,006 | 11/1967 | Belson | 101/93 |
| 3,857,075 | 12/1974 | Sawyer | 318/38 |
| 4,099,106 | 7/1978 | Nikaido | 318/115 |
| 4,423,361 | 12/1983 | Stenudd et al. | 318/135 |
| 4,480,202 | 10/1984 | Leutner et al. | 310/12 |
| 4,506,215 | 3/1985 | Conglin | 324/158 P |
| 4,518,910 | 5/1985 | Hottenrott et al. | 324/158 P |
| 4,761,574 | 8/1988 | Nakagawa | 310/12 |
| 4,769,565 | 9/1988 | Teramachi | 310/12 |
| 4,785,210 | 11/1988 | Maruyama et al. | 310/12 |
| 4,786,832 | 11/1988 | Nagakawa et al. | 310/12 |
| 4,788,477 | 11/1988 | Teramachi | 318/135 |
| 5,006,793 | 4/1991 | Gleason et al. | 324/158 P |

OTHER PUBLICATIONS

"Constant Velocity Systems Using Sawyer Linear Motors" by Nordquist et al., Fifteenth Annual Symposium, Incremental Motion Control Systems Society, Jun. 1986, pp. 215–231.

"Two-Axis Sawyer Motor For Motion Systems" by Pelta, IEEE Control Systems Magazine, Oct. 87, pp. 20–24.

Primary Examiner—Steven L. Stephan
Assistant Examiner—Matthew Nguyen
Attorney, Agent, or Firm—Perman & Green

[57] ABSTRACT

An actuator for use in positioning a probe. The actuator has a magnet, two C-shaped cores on opposite sides of the magnet, an electromagnetic coil, and an armature movably connected with the cores. The armature has a projecting face located over portions of both pole faces for each core for the entire range of motion of the armature. The armature is primarily retained with the cores by magnetic attraction by the magnet. The actuator also has an armature position sensor which can include either an optical sensor or a magnetic sensor. A test probe is mounted to the armature which can be preloaded and have dual springs to prevent scrubbing and increase contact force with an object being tested.

23 Claims, 3 Drawing Sheets

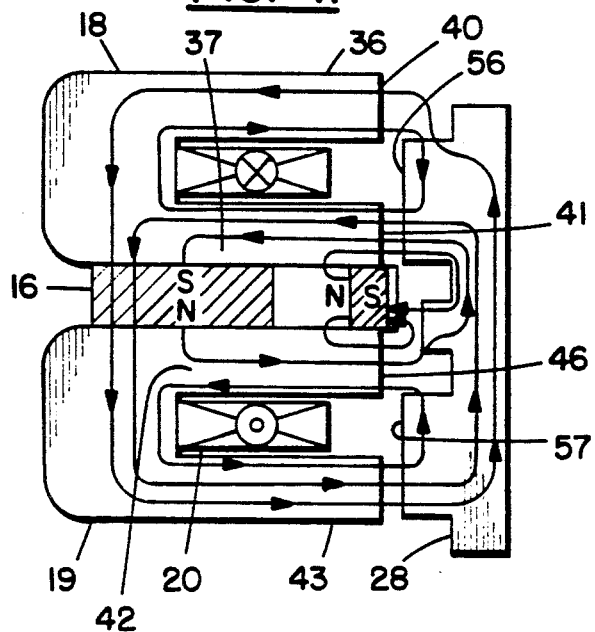
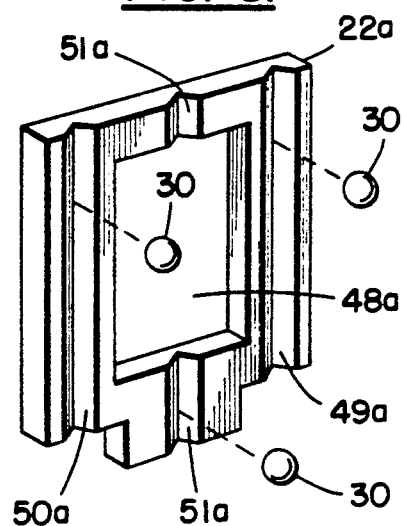
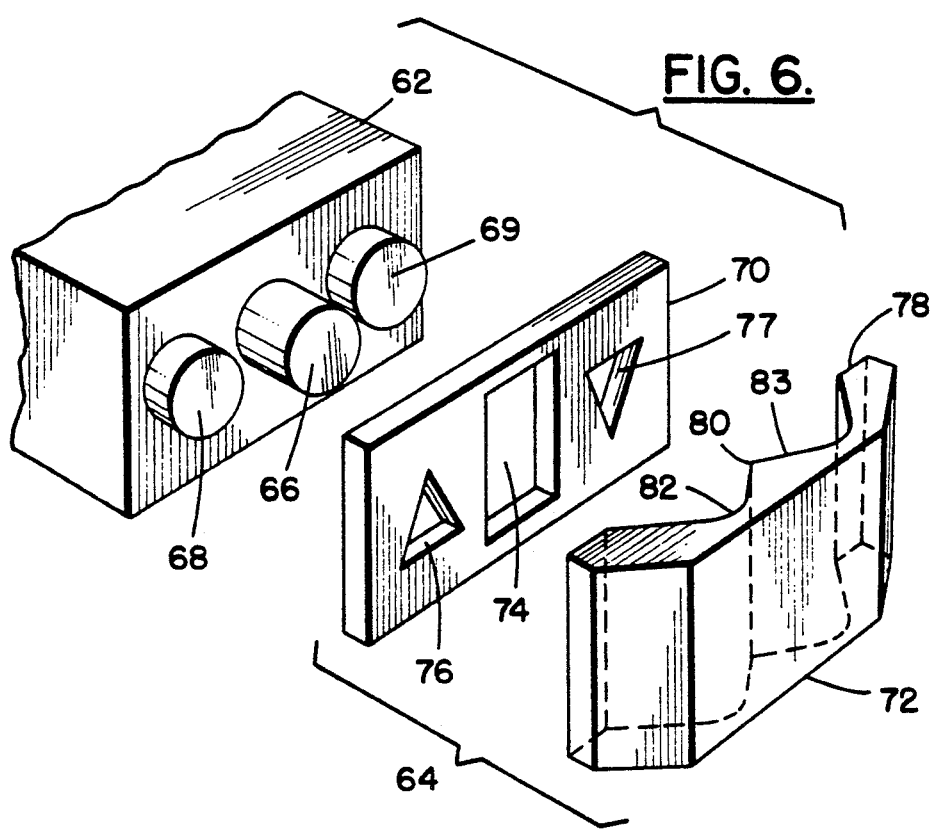

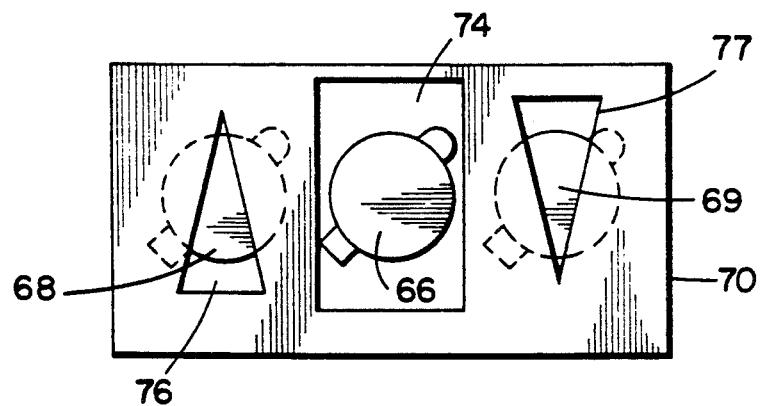
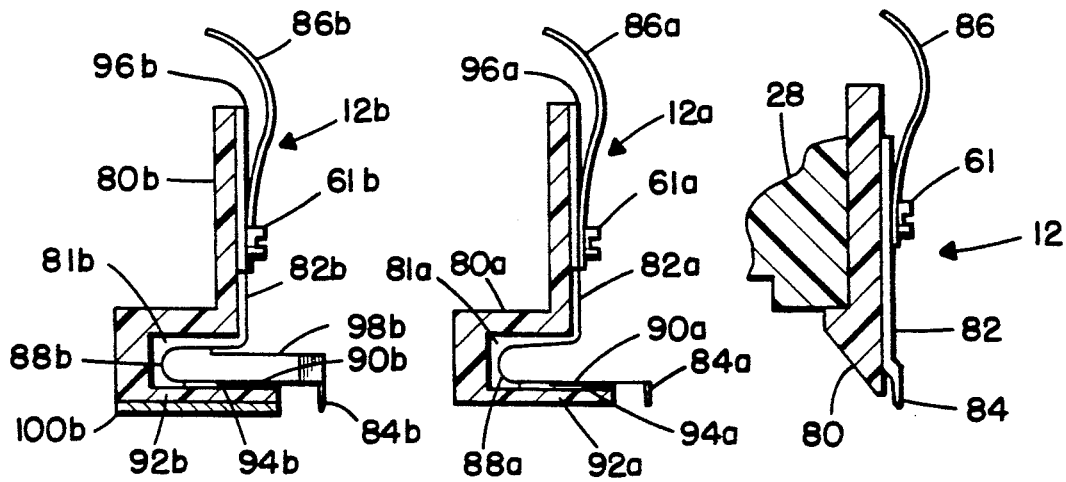
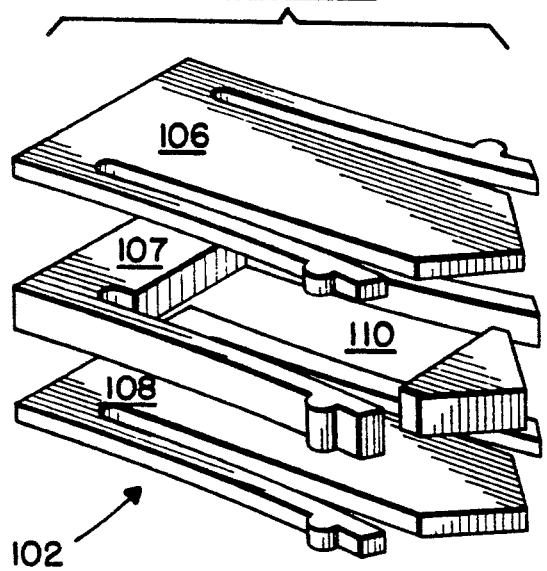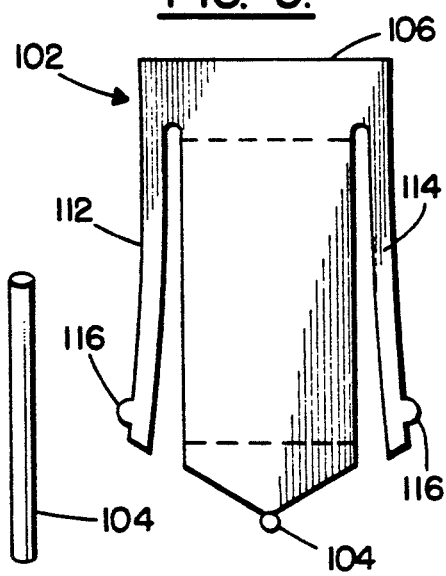

PROBE POSITIONING ACTUATOR

BACKGROUND OF THE INVENTION

1. Field of the Invention

The present invention relates to a positioning apparatus and, more particularly, to an electromagnetic probe positioning actuator.

2. Prior Art

Various types of positioning actuators are known in the prior art. One such device is known as a Sawyer linear motor that uses electromagnetic coils and tracks of ferromagnetic material having extending poles to provide linear controlled motion. Various types of these motion or positioning devices can be found in U.S. Pat. Nos. 3,351,006; 3,875,075; 4,099,106; 4,480,202; 4,761,574; 4,785,210; and 4,788,477.

One of the problems encountered with the prior art is that there was no suitable low mass device that could provide linear motion with high accelerations over a relatively long stroke. Nor was there a suitable probe that could provide a well controlled contact force, minimum impacting mass, controlled probe scrub with an object being tested, and good electrical shielding.

It is therefore an object of the present invention to overcome problems in the prior art and provide a new and improved linear positioning actuator and probe.

SUMMARY OF THE INVENTION

The foregoing problems are overcome and other advantages are provided by a new and improved electromagnetically controlled actuator and probe.

In accordance with one embodiment of the present invention, an electromagnetic actuator is provided comprising a magnet, two C-shaped cores, an electromagnetic coil, and an armature movably connected with the cores. The magnet has a north pole and a south pole. The first C-shaped core has a first leg adjacent the magnet south pole, a second leg, and a space between the first core legs. Each of the first core legs forms a pole face. The second C-shaped core has a first leg adjacent the magnet north pole, a second leg, and a space between the second core legs. Each of the second core legs forms a pole face and all four legs are aligned in a row. The electromagnetic coil is located in the core spaces and at least partially surrounds the first legs. The armature is movably connected with the cores and is comprised of ferromagnetic material with a first projecting face proximate the first core pole faces and a second projecting face proximate the second core pole faces. Each of the projecting faces is located over portions of both of the pole faces for each one of their respective cores for the entire range of motion of the armature whereby current flow through the coil can move the armature.

In accordance with another embodiment of the present invention, an electromagnetic actuator is provided comprising a stator and a movable armature. The stator has two cores forming four poles with faces aligned in a row, a magnet located between the cores, and an electromagnetic coil surrounding two of the poles in a center of the row, the two surrounded poles comprising one of the poles from each of the cores. The armature is movably connected with the stator for linear movement relative thereto. The armature comprises ferromagnetic material and has at least two projecting faces, each of the faces being suitably sized, shaped and positioned opposite portions of both of the poles of one of the cores for an entire range of motion of the armature such that current flowing in the coil can produce a net force on the armature that is substantially proportional to the coil current.

In accordance with another embodiment of the present invention, an actuator is provided comprising a stator frame, a magnet, at least three rollers, an armature, an armature frame, and means for moving the armature relative to the frame. The two frames have at least two linear grooves. The magnet is connected to the stator frame. The armature is connected to the armature frame. The rollers are positioned in the frame grooves and the armature frame has grooves located opposite the stator frame grooves with the rollers therebetween. The armature comprises ferromagnetic material with the magnet magnetically attracting and retaining the armature with the frame. The means for moving the armature relative to the frame can move the armature in a linear path with magnetic flux from the magnet primarily retaining the armature with the frame.

In accordance with another embodiment of the present invention, an actuator is provided comprising a stator, an armature movably mounted with the stator for linear movement thereon, means for moving the armature relative to the stator, and a position sensor. The position sensor can sense the position of the armature relative to the stator and comprises a first section on the stator, and a second section on the armature. The first section has at least one light source and at least one photodetector. The second section has means for reflecting light from the light source to the photodetector and means for variably controlling passage of light from the light source to the photodetector dependent upon the position of the armature relative to the stator. The means for controlling comprises a light limiter on the armature having at least one shaped aperture for the passage of light therethrough such that movement of the armature moves the light limiter to change the amount of light being transmitted through the shaped aperture and received at the photodetector to thereby indicate the position of the armature relative to the stator based upon the amount of light received at the photodetector.

In accordance with another embodiment of the present invention, an actuator is provided comprising a stator, an armature movably mounted with the stator for linear movement thereon, means for moving the armature relative to the stator, and a test probe mounted with the armature. The test probe has a probe frame, a probe member with a tip intended to physically contact an object to be tested, and means for at least partially resiliently mounting the probe member to the probe frame such that the probe tip can deflect relative to the probe frame upon contact with an object being tested. The test probe also comprises means for preloading the means for resiliently mounting the probe member to thereby increase contact force of the probe tip against the object being tested upon movement of the armature to a test position and deflection of the probe tip by contact with the object.

BRIEF DESCRIPTION OF THE DRAWINGS

The foregoing aspects and other features of the invention are explained in the following description, taken in connection with the accompanying drawings, wherein:

FIG. 4 is a diagrammatical view of the actuator shown in FIG. 3 with its armature at a second position and showing the flux flow paths.

FIG. 5 is a perspective view of an alternate embodiment of raceway for use with the present invention.

FIG. 6 is an exploded perspective view of an alternate form of position sensor for use with the actuator shown in FIG. 1.

FIG. 6A is a schematic front view of the limiter, and LED and photodetectors of the position sensor shown in FIG. 6.

FIG. 7A is a schematic cross-sectional side view of one embodiment of a test probe for use with the actuator shown in FIG. 1.

FIG. 7B is a schematic cross-sectional side view of an alternate embodiment of the test probe.

FIG. 7C is a schematic cross-sectional side view of an alternate embodiment of the test probe.

FIG. 8 is an exploded view of an alternate embodiment of a probe member for use with a probe frame or housing and probe tip to comprise a test probe.

FIG. 9 is a top view of the probe member shown in FIG. 8.

DETAILED DESCRIPTION OF THE INVENTION

Figure 1:
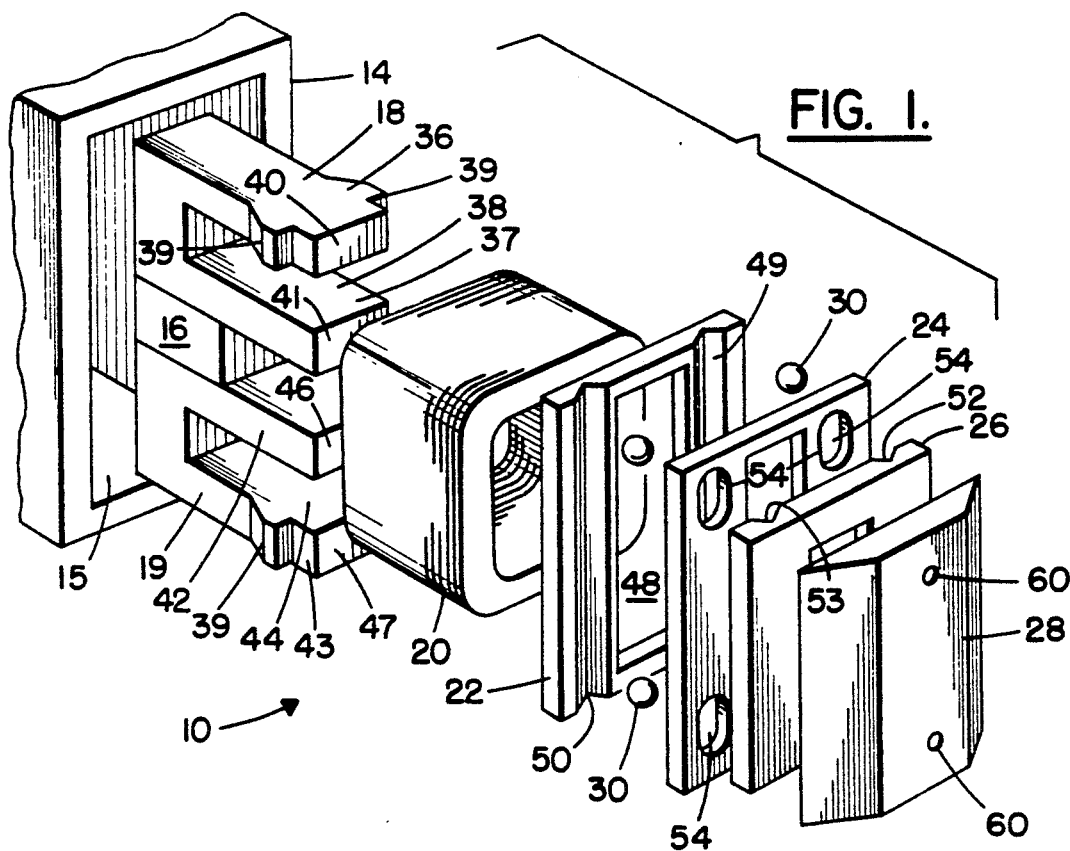
FIG. 1 is an exploded perspective view of one embodiment of an actuator incorporating features of the present invention.

Referring to FIG. 1, there is shown an exploded view of an electromagnetic actuator 10 for use in positioning a test probe 12, 12a, 12b (see FIGS. 7A, B, C) relative to an object to be tested (not shown). Although the present invention will be described with reference to testing an object, it should be understood that the present invention can include any suitable type of actuator and/or test probe. The actuator and test probe can also be comprised of any suitable size, shape, or type of elements or materials and should not be limited by the description of the preferred embodiments herein.

Figure 2:
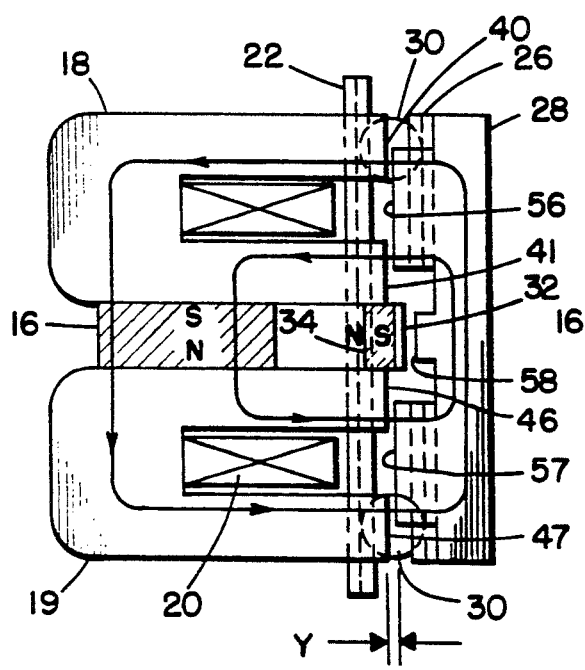
FIG. 2 is a schematic side view of the actuator shown in FIG. 1.

The actuator 10 shown in FIG. 1 is an electromagnetic actuator intended to be mounted to a frame 14. In a preferred embodiment, the frame or housing 14 is part of an X-Y positioner such as that disclosed in copending U.S. patent application Ser. No. 07/596,111, filed Oct. 11, 1990, assigned to the same assignee as herein, which is hereby incorporated by reference in its entirety herein. The actuator 10, in the embodiment shown, generally comprises a permanent magnet 16, two C-shaped cores 18 and 19, an electromagnetic coil 20, a stator race 22, a roller or ball cage 24, an armature race 26, an armature 28, and four balls or rollers 30 (only three of which are shown). Referring also to FIG. 2, the actuator 10, in the embodiment shown, also comprises an electromagnetic position sensor comprising a magneto-resistor 32 mounted on a biasing magnet 34. However, it should be understood that this type of sensor need not be provided.

The permanent magnet 16 is generally sandwiched between the two cores 18 and 19 and has a north pole adjacent the bottom core 19 and a south pole adjacent the top core 18. Both cores 18 and 19 are comprised of a ferromagnetic material. The first core 18 comprises two legs 36 and 37 with a space 38 therebetween. Each one of the legs 36 and 37 constitute a pole with pole faces 40 and 41. The second core 19 comprises two legs 42 and 43 with a space 44 therebetween. Each one of the second core legs 42 and 43 also constitute a pole with pole faces 46 and 47. The cores 18 and 19 also include mounting projections 39 on the sides of the core legs 36 and 43. The projections 39 are used to mount the stator raceway 22 to the cores 18 and 19 and, to mount the stator to the housing 14. The cores 18 and 19 are arranged such that one leg of each core is adjacent the permanent magnet 16 and all of the legs are aligned in a row. The cores 18 and 19, magnet 16, and coil 20 generally constitute a stator.

The coil 20 is connected to the cores 18 and 19 and passes through both spaces 38 and 44, thus at least partially surrounding the magnet 16 and two inner legs 37 and 42 with a coil wind transverse to the legs 36, 37, 42, 43. Suitable means (not shown) for connecting the coil 20 to a power source (not shown) is provided such as an electrical flex cable. Suitable control means (not shown) can also be provided to selectively energize the coil 20 when desired.

The cores 18 and 19, magnet 16 and coil 20 are all preferably mounted in frame cavity 15 with the pole faces 40, 41, 46 and 47 extending out past the end of the frame 14. The stator race 22 is preferably fixedly mounted to the stator mounting projections 39 on the core legs 36 and 43 with the pole faces 40, 41, 46 and 47 extending therepast. The stator race 22 is preferably comprised of a relatively hard non-magnetic material to prevent wear due to movement of rollers or balls 30 thereon and is preferably bonded onto the projections 39. However, any suitable means can be used to connect the stator race 22 to cores 18 and 19 or to the frame 14. The stator race 22 generally comprises a center aperture 48 and two longitudinal V-shaped grooves 49 and 50 located on opposite sides of the aperture 48. The grooves 49 and 50 need not be V-shaped, but are generally provided so that there is a path for balls 30 to roll in; the balls 30 being at opposite ends of each groove. Alternatively, more than two grooves can be provided on the stator race. The aperture 48 is suitably sized and shaped to allow the pole faces 40, 41, 46 and 47 to extend at least partially therethrough.

The armature race 26 is substantially a mirror image of the stator race 22 with an aperture for passage of portions of the armature therethrough and two longitudinal V-shaped grooves 52 and 53. The armature race 26 is also comprised of a relatively hard material to prevent wear from movement of the balls 30 thereon and is preferably bonded to the armature 28. However, any suitable fixation means can be used. The ball cage 24 generally comprises a flat plate of material, such as metal or plastic, with a central aperture 55 for passage of portions of the stator and armature therethrough, and with four oblong apertures 54 suitably sized and shaped to allow the balls 30 to longitudinally move a limited distance or travel therein. The ball cage 24 is generally provided to cooperate with the balls 30, race grooves 49, 50, 52, 53, and armature poles 56 and 57, to limit the longitudinal movement of the armature 28 relative to the stator and to help retain the balls 30 with the actuator 10. In the illustrated embodiment, motion of the armature 28 is limited not by the interference of the balls and the cage 24, but by the interference of the armature 28 with the cage 24, which is fixed. Aperture 55 of cage 24 surrounds the armature poles and allows only limited motion. Ball cage 24 limits the motion of the balls, which might otherwise tend to slowly migrate in a manner independent of the armature motion.

There are two apertures 54 on each side of the ball cage 24 that align with the grooves 49, 50, 52, 53 of the stator and armature races. The ball cage 24 can be fixedly connected to either the stator race 22 or the armature race 26. Alternatively, the ball cage 24 can be provided as not attached to either race or relatively free floating. In yet another embodiment, the ball cage 24 need not be provided such as when the races 22 and 26 have limited length grooves. It should also be understood that any suitable alternative or additional means could be provided to control movement and retainment of the balls 30 or movement of the armature 28 relative to the stator.

The balls 30 are generally comprised of hard, and preferably nonmagnetic, material and act as separators and bearings between the stator race 22 and armature race 26. Although balls are used as rollers in the embodiment shown, it should be understood that any suitable type of rollers or bearings could be provided. In addition, although four balls 30 are described in the embodiment shown, it should also be understood that any suitable number of rollers could be provided as well as any suitable type of bearing assembly. The balls 30, in the embodiment shown, in addition to functioning as separators, also are used to establish a specific air gap dimension Y, as shown in FIG. 2, between the stator pole faces 40, 41, 46, 47 and the armature projecting faces 56 and 57.

The armature 28, in the embodiment shown, is generally comprised of a ferromagnetic material such that it can be moved relative to the stator by magnetic interaction of the magnet 16, stator cores 18 and 19, coil 20 and armature 28. The armature 28 generally comprises the two projecting faces 56 and 57 as well as the smaller projecting face 58 that is used for position sensing. The armature 28 has screw holes 60 for mounting the test probe 12 (see FIGS. 7A, B, C) thereto.

Referring now to FIGS. 1-4, the operation of the actuator 10 will now be described. Generally, the armature 28 is intended to be movable over a limited length or travel in a linear path. A preferred embodiment uses the actuator 10 to provide vertical or Z-axis travel and is used in conjunction with the X-Y positioner described above. The armature 28 is retained to the stator merely by the magnetic attraction of the magnet 16. However, additional means for retainment may also be provided. As can be seen, the armature projecting faces 56 and 57 are relatively large. The first projecting face 56 is located in close proximity to both the pole faces 40 and 41 of the stator top core 18 for the entire range of motion of the armature 28. The second projecting face 57 is located in close proximity to both the pole faces 46 and 47 of the stator bottom core 19 for the entire range of motion of the armature 28. FIG. 2 shows the actuator 10 at a rest position with no current flowing through the coil 20. In this rest position, the magnetic flux from the magnet 16 travels through the stator legs or poles and armature 28 to retain the armature 28 with the stator, separated by balls 30, and also acts to position the armature 28 at the position shown.

Figure 3:
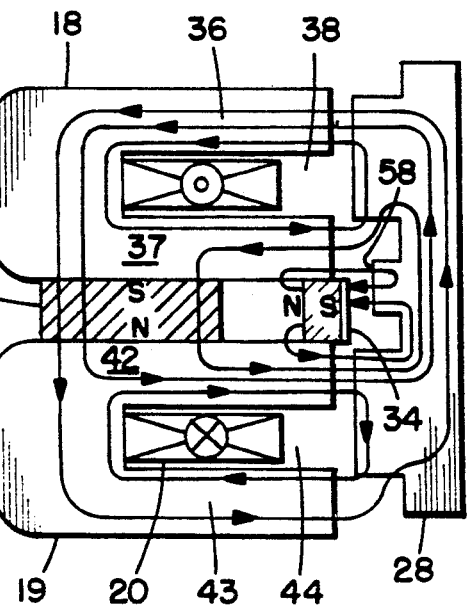
FIG. 3 is a diagrammatical view of the actuator shown in FIG. 2 with its armature at a first position and showing the flux flow paths.

In the embodiment shown, the coil 20 is capable of being energized in both directions to move the armature 28 either up or down. In an alternate embodiment, the coil 20 need only be energizable in a single direction to move the armature 28 either only up or only down with the return to the rest position merely being accomplished by the permanent magnet 16 when the coil is deenergized or by a simple spring (not shown). As shown in FIG. 4, when the coil 20 is energized in a first direction, magnetic flux generated by the coil opposes the permanent magnet flux in poles 36 and 42 and adds to the magnet flux in poles 37 and 43. This produces a net magnetic force downward to drive the armature 28 down as shown. The armature 28 is allowed only a limited travel down, due to the interference of the armature poles with the ball cage (if it is fixed to the stator), and stops at the position shown in FIG. 4 wherein the projecting faces of the armature 28, due to their large size, each still cover or are in close proximity over at least a portion of both of their respective stator pole faces. By deenergizing the coil 20, the armature 28 will move back to its rest position shown in FIG. 2 due to the magnetic attraction of the magnet 16. Alternatively, to move the armature upward at a faster rate than that which would be achieved by the magnet 16 alone, the direction of the current in the coil 20 can be reversed as shown in FIG. 3. As can be seen, the coil flux opposes the permanent magnet flux in poles 37 and 43 and adds to the magnet flux in poles 36 and 42, thus resulting in a net upward force on the armature 28.

Referring also to FIG. 5, there is shown one embodiment of an alternate type of race. FIG. 5 shows a perspective view of a stator race 22a. The armature race would be substantially a mirror image of the stator race shown. The stator race 22a has a central aperture 48a, two side grooves 49a and 50a, and a center groove 51a. The embodiment shown is intended for use with at least three rollers 30 which would be positioned in the grooves 49a, 50a, and 51a for movement therealong. With the three roller configuration shown, the rollers could be positioned in a triangular fashion to prevent torsion of the races and to ensure consistent load-sharing between the balls. This minimizes ball skidding and the resistance to the free linear movement of the armature. Another alternate embodiment might include two elongate rollers, one located above the center aperture and one below, with suitable lateral movement restricting guides. However, any suitable roller or crossed-roller embodiment could be used.

A variety of closed-loop control schemes can be used to control the magnitude and direction of the coil current so as to make the armature position follow whatever input commands are provided. In the embodiment shown in FIG. 3, the armature position sensor comprises the magneto-resistor 32 and magnet 34 which is mounted orthogonally between the two cores 18 and 19. The armature small projecting face 58 projects towards the magneto-resistor 32. When the position of the armature 28 changes, the flux distribution through the magneto-resistor 32 is varied. This causes a resistance change of the magneto-resistor 32 and thus produces an output voltage proportional to the armature position. Since the actuator 28 is capable of very high accelerations, the proper choice of control techniques can result in very fast positioning response. Poles 37 and 42 share some of the flux of the small magnet 34, thus some cross-coupling occurs between the coil and the position sensor 32. By carefully selecting the relative polarity of both magnets 16 and 34, the small effect of the coil current on the position sensor voltage can be largely negated with a simple modification in the servo amplifier.

Referring now also to FIGS. 6 and 6A, an alternate embodiment of position sensor is shown. In the embodiment shown, the position sensor is comprised of a first section 62 and a second section 64. The first section 62 is generally comprised of a light source 66, such as a light emitting diode (LED), and two laterally positioned photodetectors 68 and 69; all facing in the same direction. However, any suitable number or type of light sources or photodetectors could be provided with any suitable positioning as will further be understood below. The second section 64 is generally comprised of a relatively thin face plate 70 and an optical surface member 72. The face plate 70 has a center aperture 74 and two laterally positioned shaped apertures 76 and 77. In the embodiment shown, the two laterally positioned shaped apertures 76 and 77 are of triangular shape with one shape being reversed or inverted relative to the other. The optical surface member 72, in the embodiment shown, is comprised of aluminum which has been shaped and polished to function as a light beam splitter and as dual reflecting surfaces. However, any suitable type of optical surface member could be provided, such as reflectively coated plastic. The front face 78 of the optical surface member 72 has a center ridge 80 and two recessed shaped areas 82 and 83.

In the preferred embodiment of using the optical sensor shown, the first section 62 is fixedly mounted with respect to the stator and the second section 64 is fixedly mounted with respect to the armature so that movement of the armature will move the second section 64 relative to the first section 62. However, in an alternate embodiment, the positions of the first and second sections might be reversed. The face plate 70 is fixedly connected to the front face 78 of the optical surface member 72 by suitable means such as adhesive. The center aperture 74 is located opposite the ridge 80 and the two shaped apertures 76 and 77 are located opposite the recessed shaped areas 82 and 83; one of each shaped aperture opposite one of each recessed shaped area. In the embodiment shown, the first and second sections 62 and 64 are positioned very close to each other with the leading portion of the light source 66 projecting into the face plate center aperture 74. The center aperture 74 is elongate in shape such that the second section 64 can move relative to the first section 62 with the light source 66 in the center aperture 74 without interference along the entire range of motion of the armature and second section. The leading edges of the photodetectors 68 and 69 are located in close proximity to the two lateral shaped apertures 76 and 77, but do not project thereinto. Suitable means may be provided to block or to compensate for ambient light.

The light from the light source 66 can project through the face plate center aperture 74 and is split by the ridge 80. The two split light components are reflected twice by the shaped recessed areas 82 and 83 back towards the first section 62. However, prior to exiting the second section 64 back to the first section 62, the two split light components must first pass through the shaped apertures 76 and 77. As can be seen best in FIG. 6A, because the second section moves relative to the first section, the triangular apertures 76 and 77, in the embodiment shown, can move up and down to vary the amount of light that passes therethrough. FIG. 6A shows the face plate 70 at a middle position. When the armature is moved up the face plate 70 moves up. Although the same amount of light travels through the center aperture 74 when the face plate 70 is in an up position, there is a greater area of the left aperture 76 over the left photodetector 68, thus more light is received by the left photodetector 68 than at the middle position shown. In an opposite fashion, because the right aperture 77 is inverted relative to the left aperture 76, in the up position, there will be a reduced area of the right aperture 77 over the right photodetector 69, thus less light is received by the right photodetector 69 than at the middle position shown. When the armature and face plate 70 move to a down position the opposite occurs, the left photodetector receives less light and the right photodetector receives more light. Due to the shaped configurations of the apertures 76 and 77, the member 70 thus functions as a variable light limiter that can be used to determine the exact position of the armature relative to the stator dependent upon the amount of light received by the photodetectors 68 and 69. Any suitable type of photodetectors can be used. However, in a preferred embodiment phototransistors are used that control an electrical current that varies in magnitude dependent upon the amount of light received. In a preferred embodiment, the optical sensor is located on a top portion of the actuator 10. However, as noted above, any suitable type of position sensor can be used. In addition, the description of the preferred embodiment of the optical position sensor given above should not be considered as limiting and may be modified or adapted into an alternate embodiment by a person with suitable skill in the art.

Referring now to FIGS. 7A, 7B, and 7C, three alternate embodiments of a test probe are shown. FIG. 7A shows a test probe 12 fixedly connected to an armature 28. The test probe 12 generally comprises a probe frame or mount 80 and a probe member 82 with a tip 84 intended to physically contact an object being tested. In the embodiment shown, the test probe is an electrical test probe, but any suitable type of test probe or end effector could be used with the actuator 10. A screw 61 is provided to cooperate with hole 60 (see FIG. 1) to physically connect the test probe 12 to the armature 28. However, any suitable type of mounting means could be provided. The screw 61 also helps to physically and electrically connect an electrical flex cable 86 to the probe member 82. The flex cable 86 is in turn connected to suitable test equipment (not shown). The test probe 12 shown in FIG. 7A is a solid member with little or no compliance or resilience when it contacts an object. This type of probe can be used in applications requiring relatively large initial impact forces since the initial impact force can be controlled by controlling the impact velocity of the rigid armature/probe assembly, and the steady-state contact force can be controlled with the steady-state actuator force. This approach may be useful when it is necessary to break through an oxide layer on the surface or when some penetration of the surface is needed. Similar approaches can also be considered for ultrasonic bonding of wires on chips, impact bonding, or erosion engraving of metallic surfaces. Furthermore, the actuator 10 might also be used as a focus servo in a variety of optical applications such as data storage or the generation of high-density printed circuit patterns.

FIG. 7B shows an alternate embodiment of test probe 12a. In the embodiment shown, the probe frame or housing 80a has a recessed area 81a. The probe member 82a is comprised of metal and has a spring section 88a. The lower portion 90a of the probe member 82a is spring biased against the lower portion 92a of the frame 80a with an insulating material 94a therebetween. A suitable upper insulator 96a is also provided to electrically insulate the probe member 82a from the probe housing 80a. Because the lower portion 90a is biased or preloaded in a downward position, a relatively large force is required to move the probe tip 84a relative to the housing 80a, thus insuring good contact between the probe tip 84a and the object being tested. This single spring embodiment also allows for scrubbing of the probe tip 84a against the object being tested due to its cantilever configuration which may be desirable to ensure good electrical contact such as when it is necessary to probe through an oxide layer or to probe through a metallic or non-metallic surface layer and make contact with a subsurface layer more suitable to the electrical measurement.

In a situation where large scrubbing may not be desirable, a test probe such as that shown in FIG. 7C can be used. In the embodiment shown, the test probe 12b is very similar to the probe described with reference to FIG. 7B. However, the probe member 82b also comprises a top portion 98b that cooperates with the lower portion 90b to form a dual spring deflection system that allows the probe tip 84b to move vertically, but with virtually no scrubbing. This is done by keeping the probe tip 84b in its vertical position. The top and lower portions 98b and 90b are normally preloaded against the lower portion 92b with the probe tip 84b extending a desired amount past the bottom of the probe housing 80b. Once the probe is positioned over the test portion, the actuator is servoed towards the surface. When the spring preload force is exceeded, the springs separate from the lower portion 92b. By utilizing a spring design with a relatively low stiffness and a relatively large preload deflection to generate the desired probe force, the actual contact force becomes relatively insensitive to the precise amount of additional spring deflection which occurs during probing. Thus, the probe force is not substantially affected by any slight variations in the substrate height or by any oscillations of the armature during servo-control. When properly designed, this configuration ensures that no contact bounce occurs during probing. When the armature is raised, the probe is lifted up and the springs 90b and 98b rest back on lower portion 92b with little or no bounce. During dynamic probing operation, the probe housing 80b and the armature 28 might move further than desired due to variations in the height of the substrate or other causes. Under these conditions, some variation in probe force will occur but excessive stress or contact forces on the probe cannot occur because a compliant polymer pad 100b on the bottom of the frame will bottom out on the substrate to limit the maximum probe force.

Referring now to FIGS. 7C, 8 and 9, an alternate embodiment of the probe member is shown. The probe member 102, as shown in an exploded perspective view in FIG. 8 and top plan view in FIG. 9, is intended to be a modular snap-in replaceable member. The probe member 102 is comprised of a probe tip 104 and three layers 106, 107 and 108 of metallic material that have been laminated together, such as by brazing. The middle layer 107 has a center void area 110. Thus, a dual spring configuration, similar to that described with reference to FIG. 7C, is provided. The probe member 102 has two cantilever arms 112 and 114 that are resiliently deflectable. Each arm 112 and 114 has a locking projection 116. The probe member 102 is provided for use with a probe housing having a receiving recess similar to recessed area 81b, but with notches on the sides for projections 116. The probe member 102 can be inserted into the probe housing recess with the arms 112 and 114 deflecting inward and then snapping back out to lock the probe member 102 with the frame as the projections 116 snap into the frame side notches. Suitable means would be provided to electrically connect the probe member 102 to the testing apparatus, such as through a spring contact pressing downward on arms 112 and 114 which also provides clearance for the vertical motion of the center portion of the probe 102. In the event the probe tip 104 becomes worn or damaged, the arms 112 and 114 can be deflected inward to remove the projections 116 from the probe frame notches and the probe member can then be removed. Subsequently, a new probe member 102 can be snap-locked into the probe frame for virtually uninterrupted use of the testing apparatus. One method of manufacturing the probe member 102 could include laminating three sheets together, the center sheet having void area 110, and then cutting away the remainder of material.

In all of the embodiments shown, the probe housing 80, 80a and 80b can serve as an electrically grounded shield for the probe tip, thus eliminating or minimizing effects of stray capacitance and noise pickup. Several prototypes of the actuator and probes described herein have been successfully fabricated and tested. The prototype actuator has a very small volume, approximately 0.35 by 0.40 by 0.30 inches. The mass of the stator assembly is approximately 2.2 grams, and the total moving mass of the armature and the probe is only 0.8 grams. The prototype can generate bi-directional forces of at least 50 grams over 0.75 mm of its 1 mm total stroke and can generate up to 150 grams under certain circumstances thus allowing very high accelerations of the armature and probe. Of particular importance is the lack of contact bounce and the consistent contact force which can be achieved with the actuator and probe designs described above. By keeping the impacting mass of the probe very low, the problems of high initial impact forces can be eliminated. The device is capable of total contact times as low as 1-2 msec. The servo-controlled Z-actuator and probe described above have several important advantages, including the following: very small size and low mass, fully compatible with high speed, high-acceleration applications; high but controllable armature acceleration; built-in miniature position sensor for closed-loop position control; precise, vertical linear motion; fast probing with no contact bounce and the ability to control initial impact force, steady-state contact force and contact scrub through minor variations in probe design and servo-control; capability of placing probes very close together and of easily replacing probes, when necessary; and ability to electrically shield the probe for capacitance measurement and other applications.

It will be understood that the the foregoing description is only illustrative of the invention. Various alternatives and modifications can be devised by those skilled in the art without departing from the spirit of the invention. Accordingly, the present invention is intended to embrace all such alternatives, modifications and variances which fall within the scope of the appended claims.

What is claimed is:
1. An electromagnetic actuator comprising:
a magnet having a north pole and a south pole;
a first C-shaped core having a first leg adjacent said magnet south pole, a second leg, and a space be- tween said first core legs, each of said legs forming a pole face;

a second C-shaped core having a first leg adjacent said magnet north pole, a second leg, and a space between said second core legs, each of said legs forming a pole face and, said first and second core legs being aligned in a row;

an electromagnetic coil located in said core spaces and at least partially surrounding said first legs; and an armature movably connected with said cores, said armature comprising ferromagnetic material and having a first projecting face proximate said first core pole faces and a second projecting face proximate said second core pole faces, each of said projecting faces being located over portions of both of said pole faces for each one of their respective cores for the entire range of motion of said armature whereby current flow through said coil can move said armature.

2. An actuator as in claim 1 further comprising means for sensing the position of said armature relative to a predetermined position.

3. An actuator as in claim 2 wherein said means for sensing comprises a magneto-resistive sensing element located between said cores.

4. An actuator as in claim 2 wherein said means for sensing comprises an optical sensor mounted with said armature and cores.

5. An actuator as in claim 1 wherein said armature is supported by rollers for movement relative to said cores.

6. An actuator as in claim 1 further comprising means for limiting movement of said armature to a predetermined range of motion.

7. An electromagnetic actuator comprising:

a stator having two cores forming four poles with faces aligned in a row, each core having two of said poles, a magnet located between said cores, and a single electromagnetic coil surrounding two of said poles in a center of said row, said two surrounded poles comprising one of said poles from each of said cores; and an armature movably connected with said stator for linear movement relative to said stator, said armature comprising ferromagnetic material and having at least two projecting faces, each of said faces being suitably sized, shaped and positioned opposite portions of both of said poles of one of said cores for an entire range of motion of said armature such that current flowing in said coil can produce a net force on said armature that is substantially proportional to the coil current.

8. An actuator comprising:

a stator having at least two linear grooves;

a magnet connected to said stator;

at least two rollers positioned in and movable along said stator grooves;

an armature having at least two linear grooves located opposite said stator grooves with said rollers therebetween, said armature comprising a ferromagnetic material with merely said magnet magnetically attracting and retaining said armature with said stator;

a roller cage adjacent said stator with portions of said rollers located therein, said magnetic attracting and retaining, said grooves, and said roller cage comprising the sole means for attracting and retaining said armature with said stator; and means for moving said armature relative to said stator such that said armature can move in a linear path with magnetic flux from said magnet retaining said armature with said stator whereby the armature can move at a fast rate of speed due to its merely magnetic retention with the stator.

9. An actuator as in claim 8 wherein said stator comprises a stator race plate having said at least two stator linear grooves.

10. An actuator as in claim 8 wherein said armature comprises an armature race plate having said at least two armature linear grooves.

11. An actuator as in claim 8 wherein said stator and armature each have three parallel grooves with rollers located in a triangular fashion relative to each other.

12. An actuator as in claim 9 further comprising the roller cage being located between said stator race plate and an armature race plate.

13. An actuator as in claim 8 wherein said grooves are V-shaped.

14. An actuator as in claim 8 further comprising means for limiting movement of said armature relative to said stator to a predetermined range of motion.

15. An actuator comprising:

a stator;

an armature movably mounted with said stator for linear movement thereon;

means for moving said armature relative to said stator; and a position sensor for sensing the position of said armature relative to said stator, said sensor comprising:

a) a first section on said stator having at least one light source and at least one photodetector; and b) a second section on said armature having means for reflecting light from said light source to said photodetector and means for variably controlling passage of light from said light source to said photodetector dependent upon the position of said armature relative to said stator, said means for controlling comprising a light limiter on said armature having at least one shaped aperture for the passage of light therethrough such that movement of said armature moves said light limiter to change the amount of light being transmitted through said shaped aperture and received at said photodetector to thereby indicate the position of said armature relative to said stator based upon the amount of light received at said photodetector.

16. An actuator as in claim 15 wherein said first section comprises two photodetectors and said second section comprises means for splitting light from said light source.

17. An actuator as in claim 16 wherein said means for splitting and said means for reflecting comprises a single member having a shaped splitting and reflecting surface.

18. An actuator as in claim 16 wherein said limiter comprises two triangular apertures, one triangular aperture being inverted relative to the other triangular aperture.

19. An actuator comprising:

a stator;

an armature movably mounted with said stator for linear movement thereon;

means for moving said armature relative to said stator; and a test probe mounted with said armature, said probe having a probe housing, a probe member with a tip intended to physically contact an object to be tested, means for at least partially resiliently biasly mounting said probe member to said probe housing such that said probe tip can deflect relative to said probe housing upon contact with the object being tested, and means for preloading said means for resiliently biasly mounting said probe member to thereby increase contact force of said probe tip against the object being tested upon movement of said armature to a test position and deflection of said probe tip by contact with the object.

20. An actuator as in claim 19 wherein said probe comprises means to reduce scrubbing of said probe tip on the object being tested.

21. An actuator as in claim 19 wherein said means for mounting includes two parallel spring sections.

22. An actuator as in claim 19 wherein said probe member is at least partially adapted to be snap-in mounted and removed from said probe housing.

23. An actuator as in claim 19 further comprising means for electrically shielding said probe.

* * * * *